(12) United States Patent  
Satoh

(10) Patent No.: US 6,859,110 B2  
(45) Date of Patent: Feb. 22, 2005

(54) HIGH-STABILITY PIEZOELECTRIC OSCILLATOR

(75) Inventor: Tomio Satoh, Kanagawa (JP)

(73) Assignee: Toyo Communication Equipment Co., Ltd., Kawasaki (JP)

( * ) Notice: Subject to any disclaimer, the term of this patent is extended or adjusted under 35 U.S.C. 154(b) by 0 days.

(21) Appl. No.: 10/413,083

(22) Filed: Apr. 14, 2003

(65) Prior Publication Data

US 2003/0197568 A1 Oct. 23, 2003

(30) Foreign Application Priority Data

Apr. 17, 2002 (JP) ........................................ 2002-114268

(51) Int. Cl.[7] .............................. H03B 1/00; H03B 5/32
(52) U.S. Cl. ........................................ 331/69; 331/158
(58) Field of Search ............................ 331/158, 66, 68, 331/69, 70, 176

(56) References Cited

U.S. PATENT DOCUMENTS

| | | | | |
|---|---|---|---|---|
| 3,668,527 A | * | 6/1972 | Easton | ........................ 455/99 |
| 6,147,565 A | | 11/2000 | Satoh et al. | |
| 6,621,361 B1 | * | 9/2003 | Fry | .............................. 331/69 |

FOREIGN PATENT DOCUMENTS

| JP | 03-104404 A1 | 5/1991 |
|---|---|---|
| JP | 10-294618 A1 | 11/1998 |
| JP | 11-317622 A1 | 11/1999 |
| JP | 2000-101346 A1 | 4/2000 |
| JP | 2000-183649 A1 | 6/2000 |
| JP | 2000-254585 A1 | 9/2000 |
| JP | 2001-16034 A1 | 1/2001 |
| JP | 2001-196857 A1 | 7/2001 |
| JP | 2001-274626 A1 | 10/2001 |
| JP | 2002-135051 A1 | 5/2002 |
| JP | 2002-314339 A1 | 10/2002 |

OTHER PUBLICATIONS

Patent Abstracts of Japan for JP 10–294618 published on Nov. 4, 1998.
Patent Abstracts of Japan for JP 2001–016034 published on Jan. 19, 2001.
Patent Abstracts of Japan for JP 2000–196361 published on Jul. 14, 2000.
Patent Abstracts of Japan for JP 03–104404 published on May 1, 1991.
Patent Abstracts of Japan for JP 11–317622 published on Nov. 16, 1999.
Patent Abstracts of Japan for JP 2000–101346 published on Apr. 7, 2000.

(List continued on next page.)

*Primary Examiner*—David Mis
(74) *Attorney, Agent, or Firm*—Darby & Darby

(57) ABSTRACT

[Object of the invention] To provide designing means that prevents deterioration through thermal aging of an electronic part used in high-stability piezoelectric oscillators and the like when the high end of the usage temperature is 85 deg C.

[Means for solving the problem] In a high-stability piezoelectric oscillator equipped with: a first isothermic oven housing a piezoelectric vibrator and an electronic part; a second isothermic oven; a case; and the like, a high-stability piezoelectric oscillator wherein a temperature of the first isothermic oven is set to be lower than a temperature of a second isothermic oven using a Peltier element or the like.

2 Claims, 3 Drawing Sheets

OTHER PUBLICATIONS

Patent Abstracts of Japan for JP 2000–183649 published on Jun. 30, 2000.
Patent Abstracts of Japan for JP 2000–254585 published on Sep. 19, 2000.
Patent Abstracts of Japan for JP 2001–196857 published on Jul. 19, 2001.
Patent Abstracts of Japan for JP 2001–274626 published on Oct. 5, 2001.
Patent Abstracts of Japan for JP 2002–135051 published on May 10, 2002.
Patent Abstracts of Japan for JP 2002–314339 published on Oct. 25, 2002.

* cited by examiner

HIGH-STABILITY PIEZOELECTRIC OSCILLATOR

BACKGROUND TO THE PRESENT INVENTION

The present invention relates to a high-stability piezoelectric oscillator. In particular, the present invention relates to a high-stability piezoelectric oscillator in which, by using a peltier element as the temperature regulating element of the inner oven of a double oven, its temperature can be set to be lower than the outer oven.

Because high-stability crystal oscillators (OCXO) have an excellent frequency precision, frequency temperature characteristic, frequency aging characteristic and the like, it has various uses, from mobile wireless base stations to high precision measuring devices. In order to prevent changes in oscillation frequency even with fluctuations in the ambient temperature, the high stability crystal oscillator has a construction in which the crystal oscillator and the oscillator circuit are housed inside an oven. For a high stability crystal oscillator requiring even greater precision, a double rotation cut SC cut crystal oscillator or IT cut crystal oscillator are used. This results in a crystal oscillator with excellent stress sensitivity and heat impact resistance as compared to when an AT cut crystal oscillator is used.

Referring to FIG. 2, with the horizontal axis as frequency and the vertical axis as reactance, this figure shows the reactance characteristic near the resonance of the SC cut crystal oscillator. The main oscillation, which has the lowest frequency of the three modes that are excited, is the thickness slide oscillation mode (C mode). At higher frequencies than this vibration mode, there are a thickness torsion mode (B mode) and a thickness height mode (C mode) and the like. The resonance frequency (f2) of the B mode, which is adjacent to the main vibration C mode (resonance frequency f1), is present at an approximately 9–10% higher frequency than the resonance frequency f1 of the C mode, and as a result, there are various strategies in the oscillation circuit to avoid the frequency jump phenomenon.

Referring to FIG. 3, this shows the frequency temperature characteristic of the SC cut oscillator (C mode). The horizontal axis is temperature (degrees C.), and the vertical axis is the standardized frequency change ($\Delta f/f$). There is presented a third order curve with an inflection point temperature (Ti) of approximately 95 degrees C. The peak temperature Tp, which is at a lower temperature than the inflection point temperature and indicates a zero degree coefficient, is dependent on the double rotation angle that is cut, and the set range for the peak temperature Tp is approximately 65–81 degrees C. Therefore, by setting the temperature inside the oven to be near the peak temperature Tp, a stable frequency is achieved.

For example, if the usage temperature range for the high-stability crystal oscillator is in the range of 0 to 50 degrees C., the oscillator is constructed so that the temperature inside the oven is maintained at a temperature 10 to 20 degrees higher than the upper limit of the usage temperature of 50 degrees C., for example 70 degrees C. By using a SC cut crystal oscillator with a peak temperature Tp of around 70 degrees C., a stable frequency that is not affected by the temperature around the oscillator is outputted.

Referring to FIG. 4, there is a cross-section showing a construction of a highly stable crystal oscillator. An SC cut crystal oscillator 22, an electric part 23 for oscillation, a temperature sensor 24, and the like are mounted onto a printed board 21, and this is housed inside an oven 25. A heater 26 is wrapped around oven 25. From printed board 21, a power source terminal 27 and an output terminal 27 and the like pass through oven 25 and a base 28 in an insulated manner using a hermetic terminal and the like. Furthermore, base 28 is covered by a case 29, and the joining section is sealed by soldering or the like. The operation of the oven is to have current flow in heater 26 by applying voltage to terminal 27 and to maintain a constant temperature for oven 25 by a temperature sensor and a control circuit.

In recent years, there has been a demand for high-stability crystal oscillators that have stable operation even when the ambient temperature is high. For example, when the usage temperature range is from 0 degrees C. to 85 degrees C., it is necessary to set the temperature of the oven to approximately 95 degrees C. which is a temperature higher than the upper limit of the usage range of 85 degrees C.

However, the standard for electric parts of oscillating circuits is mostly around 85 degrees C., and use at higher temperatures is not guaranteed. Although there exist parts for military and satellite uses that can be used at high temperatures, these are very expensive. Furthermore, crystal oscillators have accelerated aging at high temperatures, and there is a risk of having frequency shifts and the like. In addition, the peak temperature Tp of SC cut crystal oscillators is approximately 81 degrees as the upper limit. It cannot be set to be any higher.

In Japanese Laid Open Patent Number 3-104404, there is proposed a high stability crystal oscillator using a peltier element (an element that uses the peltier effect, in other words, the phenomenon, when current flows through a junction point of different types of conductor (or semiconductor), by which there is generation of heat or absorption of heat. The amount of heat generation or heat absorption is proportionate to the current, and when the direction of current is reversed, the generation and absorption of heat is reversed). For example, if the usage temperature range is from 0 to 85 degrees C., when the temperature inside the oven is set to 70 degrees C., the oven is heated or cooled by the peltier element and temperature control circuit in order to maintain 70 degrees C. With this, an SC cut crystal oscillator of a Tp=70 degrees C. is used as the crystal oscillator.

Referring to FIG. 5, there is a cross-section showing the construction of a high stability crystal oscillator using a peltier element. A SC cut crystal oscillator 32, an electric part 33 for oscillation, a temperature sensor 34 and the like are mounted on a printed board 31, and this is housed in an oven 35. A peltier element 36 is attached to oven 35. From printed board 31, a power source terminal 37 and an output terminal 37 and the like pass through oven 35 and a base 38 in an insulated manner using a hermetic terminal or the like. Furthermore, base 38 is covered by a case 39, and its joining section is sealed by soldering or the like. By running current through peltier element 36 through power source terminal 37, the temperature of oven 35 can be maintained at a specified temperature, for example at a constant 70 degrees C.

However, with the high-stability crystal oscillator using a peltier element as shown in FIG. 5, when the ambient temperature is approximately 70 degrees C., it is extremely difficult to maintain an oven temperature of 70 degrees C. because of heat capacity and the like. It is well known that temperature control of the oven is more stable and easier to control when the temperature is set at a high temperature of at least 10 to 20 degrees C. different from the ambient temperature.

OBJECT AND SUMMARY OF THE INVENTION

The object of the present invention is to solve the above problems and to provide a high stability crystal oscillator which operates stably even when the required temperature range is a wide range from 0 to 85 degrees C. In addition, the deterioration as a result of aging of the crystal oscillator and electric parts is kept very small.

In order to achieve the above objective, the invention of Claim 1 is a high-stability piezoelectric oscillator, comprising: a first oven for housing a piezoelectric oscillator and electric parts used for oscillation; a second oven for housing the first oven; and means for controlling the temperatures of each oven; the temperature of the first oven being set to be lower than the temperature of the second oven.

The invention of Claim 2 is a high-stability piezoelectric oscillator as described in Claim 1, wherein: the first oven uses a peltier element for temperature control; an SC cut crystal oscillator is used as the piezoelectric element; and the temperature of the first oven is set at approximately a peak temperature of the SC cut crystal oscillator.

The above, and other objects, features, and advantages of the present invention will become apparent from the following description read in conjunction with the accompanying drawings, in which like reference numerals designate the same elements.

DESCRIPTION OF THE PREFERRED EMBODIMENTS

The present invention is described in detail below based on embodiments shown in the figures.

Figure 1:
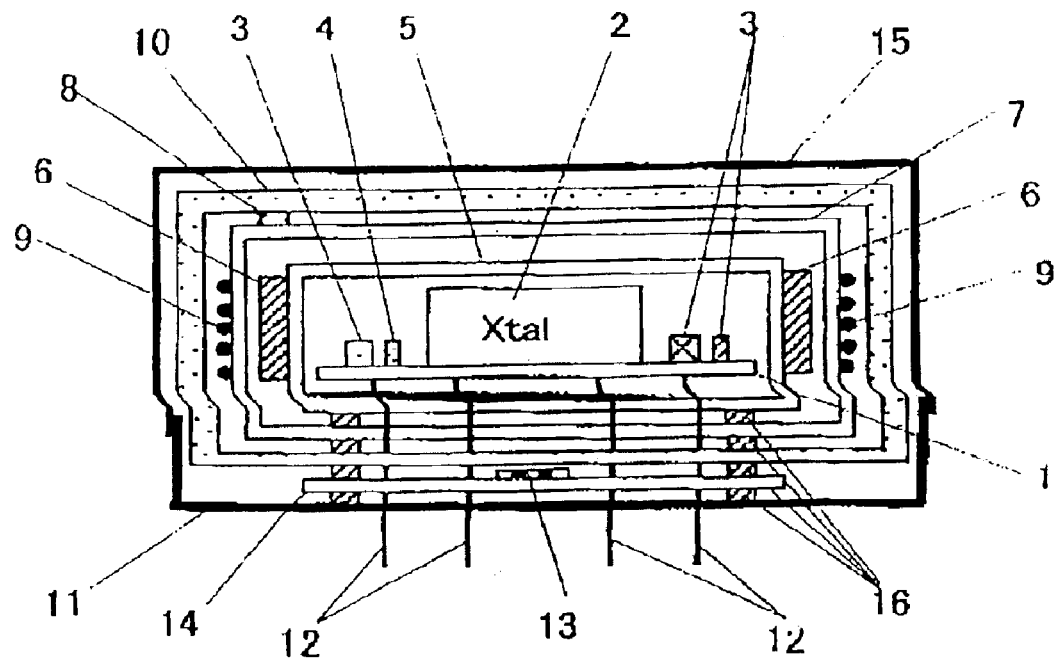
FIG. 1 is a cross-sectional drawing showing a construction of a high-stability piezoelectric oscillator of the present invention.
Figure 2:
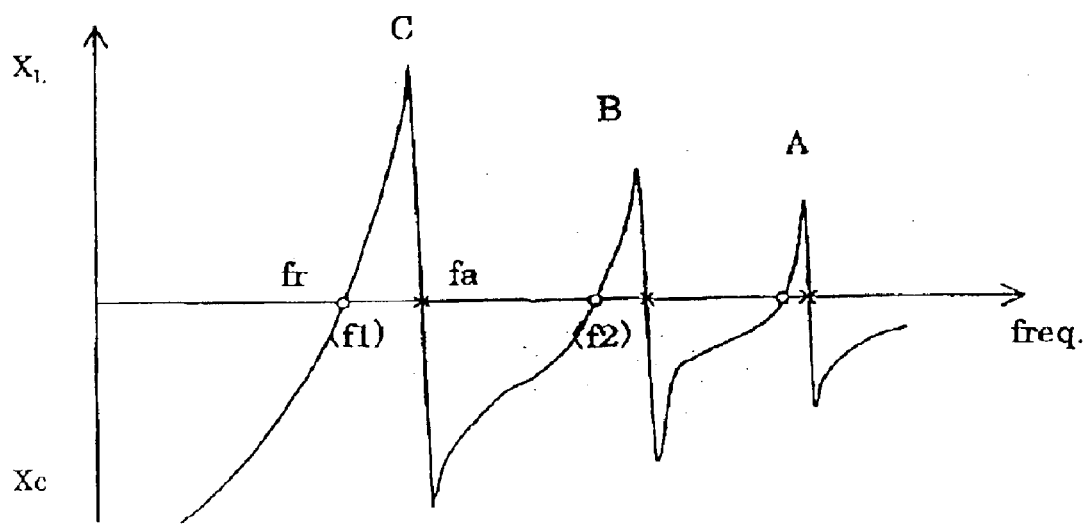
FIG. 2 is a figure showing a frequency response of the C mode, B mode, and A mode of an SC cut crystal oscillator.
Figure 3:
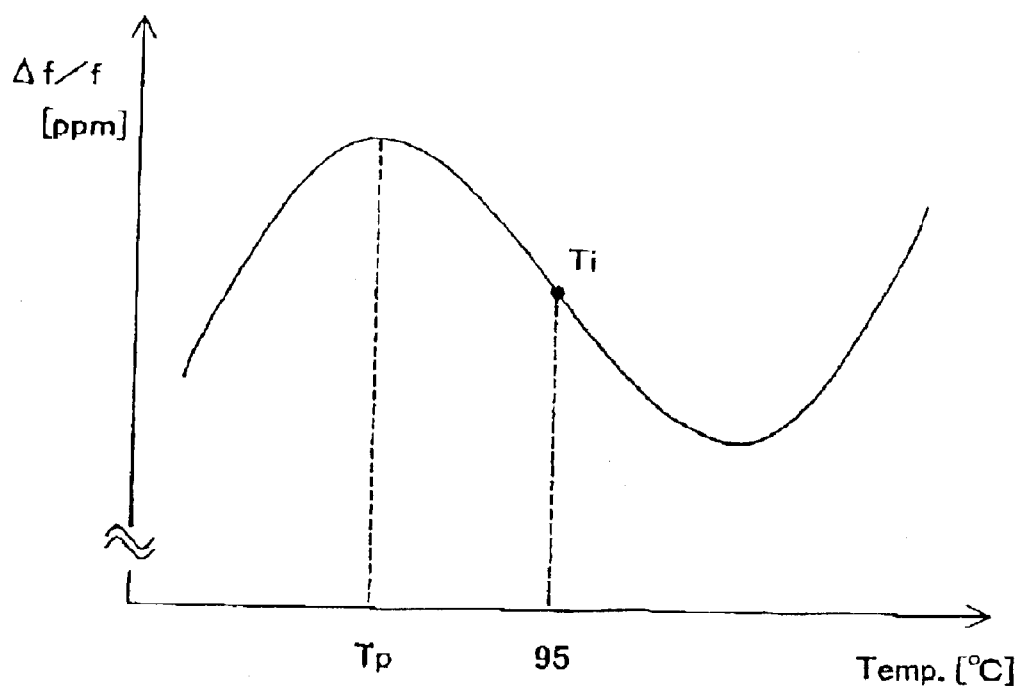
FIG. 3 is a figure showing the frequency temperature characteristic of the C mode of the SC cut crystal oscillator.
Figure 4:
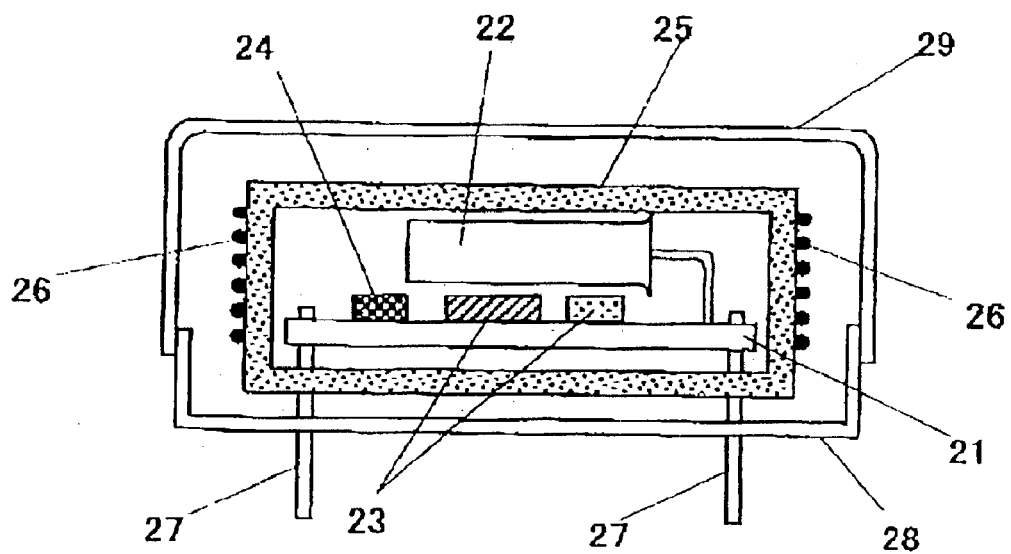
FIG. 4 is a cross-sectional drawing showing the construction of a high-stability crystal oscillator of the prior art.
Figure 5:
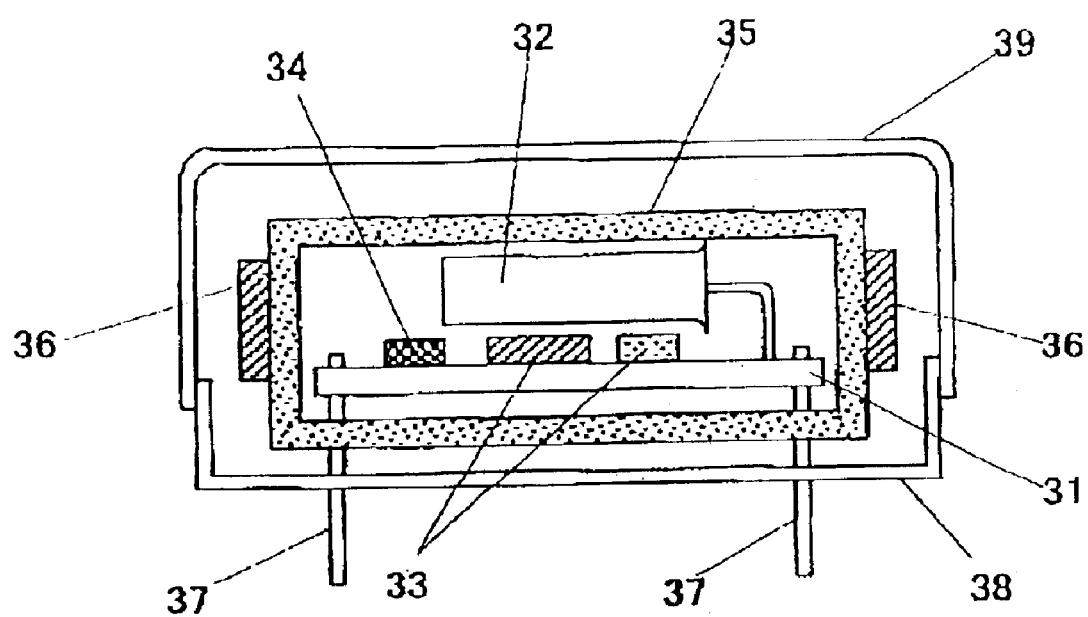
FIG. 5 is a cross-sectional drawing showing the construction of a high-stability crystal oscillator using a peltier element as an oven temperature control element.

Referring to FIG. 1, there is a cross-section of a high-stability crystal oscillator of the present invention. A SC cut crystal oscillator 2, an electric part 3, and a first temperature sensor 4 are mounted onto a printed board 1, and this is housed inside a first oven 5. A peltier element 6 is attached onto the perimeter of oven 5. Furthermore, first oven 5 is inside a second oven 7, which is larger than first oven 5. A second temperature sensor 8 is attached to second oven 7, and a heater 9 is wrapped around the oven, separated from temperature sensor 8. The entire perimeter of second oven 7 is enveloped with a heat insulation material 10. Through hermetic terminals 12, 12, . . . which are soldered onto a base 11, a second printed board 14, on which an amplifier circuit and a temperature control circuit 13 are mounted, is attached. In addition, the lead terminals 12, 12, . . . pass through heat insulation material 10, second oven 7, and first oven 5 in an insulated manner, and each of them are connected to the printed circuit formed on top of first printed board 1. Base 11 is covered with a metal case 15, and their joining part is sealed by soldering or the like.

In order to be able to withstand vibration, impact, and the like, insulation material 16, 16, . . . is placed in between each of first oven 5, second oven 7, heat insulation material 10, second printed board 14, and base 11, and they are attached by an adhesive or the like.

With the present invention, there is a double oven using first oven 5 and second oven 7. Using a heater 9 and a temperature control circuit, the temperature of the second oven is set to a temperature that is 10 to 20 degrees C. higher than the usage temperature needed, for example it is set at 95 degrees C. In addition, using a peltier element, the temperature of the first oven is set to a temperature that is lower than the second oven. In other words, for example, if the SC cut crystal oscillator has a peak temperature Tp of 70 degrees C., the temperature of the first oven is set to approximately 70 degrees C. In this manner, by having a double oven construction in which the inner oven is set to a lower temperature than the outer oven, even when there is a need for a usage temperature range that covers a wide temperature range of 0 to 85 degrees C., a SC cut crystal oscillator can be used, and excellent characteristics for stress sensitivity property and heat impact resistance and the like are achieved. In addition, because the outer second oven is set to a temperature that is sufficiently higher than 85 degrees C., which is the upper limit of the usage temperature range, a stable temperature control is possible irrespective of ambient temperature. Because the inner first oven is set to a sufficiently lower temperature than the second oven, a stable temperature control is also achieved for the first oven.

Furthermore, because the first oven is at a lower temperature than 85 degrees C., aging of the SC cut crystal oscillator and deterioration of electric parts and the like are prevented.

With the above description, the present invention is described using a SC cut crystal oscillator, but it is obvious that the present invention can also use an AT cut crystal oscillator.

The present invention is constructed as described above. Because the invention of Claim 1 has the inner oven temperature set lower than the usage temperature range, deterioration due to heat aging of the piezoelectric oscillator, electric parts and the like is suppressed. The invention of Claim 2 is an example of when an SC cut crystal oscillator is used. The inner oven temperature is set to within a design range of the peak temperature Tp of the SC cut crystal oscillator, and this invention exhibits the excellent advantage of preventing the deterioration of the crystal oscillator and electric parts.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A high-stability piezoelectric oscillator, comprising:

a first oven, said first oven housing a piezoelectric element and electric parts used for oscillation;

a second oven, said second oven housing said first oven;

a case, said case housing said second oven;

a heat-insulating material disposed between said second oven and said case; and means for controlling the temperatures of each oven, the temperature of said first oven being set to be lower than the temperature of said second oven, wherein the temperature of said second oven is 10–20 degrees Celsius higher than a maximum usage temperature of said high-stability piezoelectric oscillator.

2. A high-stability piezoelectric oscillator as described in claim 1, wherein:

said first oven uses a peltier element for temperature control;

an SC cut crystal oscillator is used as said piezoelectric element; and, the temperature of said first oven is set at approximately a peak temperature of said SC cut crystal oscillator.

* * * * *